US012652006B2

(12) United States Patent
Demirci et al.

(10) Patent No.: US 12,652,006 B2
(45) Date of Patent: Jun. 9, 2026

(54) POWER LIMITING FOR AMPLIFIERS

(71) Applicant: Cirrus Logic International Semiconductor Ltd., Edinburgh (GB)

(72) Inventors: Kemal S. Demirci, Dallas, TX (US); Tian Zhao, Austin, TX (US); Jeffrey A. May, Dripping Springs, TX (US); Theodore M. Burk, Cedar Park, TX (US); Thomas H. Hoff, Austin, TX (US); Edward M. Veeser, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 547 days.

(21) Appl. No.: 18/302,219

(22) Filed: Apr. 18, 2023

(65) Prior Publication Data

US 2023/0344388 A1     Oct. 26, 2023

Related U.S. Application Data

(60) Provisional application No. 63/415,773, filed on Oct. 13, 2022, provisional application No. 63/332,830, filed on Apr. 20, 2022.

(51) Int. Cl.
H03F 1/52          (2006.01)
H03F 3/183         (2006.01)

(52) U.S. Cl.
CPC ............... H03F 1/52 (2013.01); H03F 3/183 (2013.01); H03F 2200/03 (2013.01); H03F 2200/426 (2013.01)

(58) Field of Classification Search
CPC ........ H03F 1/52; H03F 3/183; H03F 2200/03; H03F 2200/426; H03F 3/2173; H03F 3/181; H03F 3/217; H03F 1/02; H03F 1/32; H03F 2200/462; H03F 2200/465; H03F 2200/468; H03F 2200/471; H03G 11/002

USPC ........................................................ 330/298
See application file for complete search history.

(56) References Cited

U.S. PATENT DOCUMENTS

| | | | |
|---|---|---|---|
| 6,683,494 B2 * | 1/2004 | Stanley | ................. H03F 3/2175 |
| | | | 330/10 |
| 7,808,324 B1 | 10/2010 | Woodford et al. | |
| 2017/0094408 A1 | 3/2017 | Napoli et al. | |
| 2017/0359652 A1 | 12/2017 | Serwy et al. | |

FOREIGN PATENT DOCUMENTS

WO          0126222 A1      4/2001

OTHER PUBLICATIONS

Combined Search and Examination Report under Sections 17 and 18(3), UKIPO, Application No. GB2410807.8, mailed Aug. 9, 2024.
Combined Search and Examination Report under Sections 17 and 18(3), UKIPO, Application No. GB2305661.7, mailed Oct. 23, 2023.

* cited by examiner

*Primary Examiner* — Andrea Lindgren Baltzell
*Assistant Examiner* — Khiem D Nguyen
(74) *Attorney, Agent, or Firm* — Jackson Walker L.L.P.

(57)                    ABSTRACT

This application relates to methods and apparatus for power limiting for amplifiers. An amplifier is configured to receive an input supply voltage and to draw, in use, an amplifier input current resulting in an amplifier input power. A power limiter is configured to monitor an indication of the amplifier input power, determine a first signal limit based on said indication of the amplifier input power and a pre-set limit and apply regulation to the input signal to provide a regulated input signal for input to the amplifier that does not exceed the first signal limit.

20 Claims, 8 Drawing Sheets

POWER LIMITING FOR AMPLIFIERS

FIELD OF DISCLOSURE

The field of representative embodiments of this disclosure relates to methods, apparatus and/or implementations concerning or relating to limiting power for amplifiers, and in particular to limiting output power for switched mode amplifiers or switching drivers as may be used to drive a transducer.

BACKGROUND

Many electronic devices include amplifiers, e.g., for driving a transducer with a suitable driving signal, for instance for driving an audio output transducer of the host device or a connected accessory, with an audio driving signal.

In some applications the amplifier circuitry may include a switching amplifier, e.g., a class-D amplifier output stage or the like, for generating the drive signal. Switching amplifiers, sometimes referred to as switched-mode drivers or switched-mode amplifiers, can be relatively power efficient and thus can be advantageously used in some applications. A switching driver generally operates to switch an output node between different switching voltages, with a duty cycle that provides a desired average output voltage over the course of the duty cycle for the drive signal.

In at least some implementations, the amplifier may comprise some power limiting control, for instance to limit the input current or input power drawn by the amplifier, especially in the case where the input power may come from a battery supply.

In some cases, a switching voltage for a switching amplifier may be generated from the input supply, e.g., from a battery voltage, using an inductive DC-DC converter, e.g., such as a boost converter. In such cases, the DC-DC converter will generally be current-controlled and therefore input current limiting can be readily applied to provide limiting of a maximum current draw from battery and current protection of the boost inductor and associated circuitry.

However, in some cases, for instance where one or more switching voltages for the switching driver may be generated by capacitive boosting, e.g., using a charge pump or similar, the use of conventional current limiting can result in over-limiting being applied—which can result in signal distortion.

SUMMARY

Embodiments of the present disclosure relate to method and apparatus for amplifier power limiting that at least mitigate at least some of the above-mentioned issues.

According to an aspect of the disclosure there is provided an amplifier apparatus for outputting an output signal based on an input signal comprising an amplifier configured to receive an input supply voltage and to draw, in use, an amplifier input current resulting in an amplifier input power and a power limiter. The power limiter is configured to monitor an indication of the amplifier input power, determine a first signal limit based on said indication of the amplifier input power and a pre-set limit, and apply regulation to the input signal to provide a regulated input signal for input to the amplifier that does not exceed the first signal limit.

In some examples, the power limiter may further be configured to determine a second signal limit, of lower magnitude than the first signal limit, and with a defined relationship to the first signal limit and to controllably vary a gain applied to the input signal for signal levels that exceed the second signal limit to generate the regulated input signal.

In some examples, the indication of the amplifier input power comprises an indication of the input supply voltage and an indication of the amplifier input current.

In some examples, the pre-set limit may comprise a pre-set limit of amplifier input power and/or a pre-set limit of amplifier input current. The power limiter may be configured to determine a first error condition when the amplifier input power monitored by the power limiter exceeds the pre-set amplifier input power limit or the indication of amplifier input current exceeds the pre-set amplifier input current limit; and the power limiter is configured. In the event of such a first error condition the power limiter may update the first signal limit to correct the error condition. The power limiter may additionally be configured to determine a second error condition if the amplifier input power monitored by the power limiter exceeds a maximum input power limit which is higher than the pre-set input power limit or if the indication of amplifier input current exceeds a maximum current limit which is higher than the pre-set amplifier input current. In the event of a second error condition the power limiter may be configured to update the first signal limit to correct the error condition, wherein the updating of the first signal limit is more rapid for an instance of the second error condition than for an instance of the first error condition.

In some examples, the power limiter may be configured to dynamically adjust the first signal limit based on a feedback signal of the regulated input signal and the indication of the amplifier input power. The power limiter may be configured to dynamically adjust the first signal limit based on a determined difference between the amplifier input power or amplifier input current and the pre-set input power limit or current limit, respectively, when the signal level of regulated input signal is at or within a defined range of the first signal limit. The power limiter may, for example, comprise a proportional-integral controller configured to adjust said first signal limit to minimise said determined difference.

In some examples, the power limiter may be configured to determine the first signal limit also based on one or more parameters of a first set of system operating parameters comprising input supply voltage, load impedance, amplifier efficiency and temperature. The power limiter may be configured to dynamically adapt the first signal limit in use due to changes in the one or more parameters. If the one or more parameters comprises load impedance, the power limiter may be configured to determine the load impedance from an indication of amplifier output voltage and an indication of amplifier output current. If the one or more parameters comprises amplifier efficiency, the power limiter may be configured to monitor amplifier efficiency and/or the power limiter may comprise a set of stored estimated amplifier efficiencies for different operating conditions and the power limiter may be configured to select an appropriate one of the stored estimated amplifier efficiencies based on the present system operating conditions.

In some implementations, the amplifier may comprise a switching amplifier for modulating at least one output node between different switching voltages with a controller duty-cycle to generate the output signal. The switching amplifier may be a closed-loop switching amplifier. The power limiter may be configured to receive an indication of the duty-cycle of the closed-loop switching amplifier and to dynamically adjust the first signal limit based on said indication of the duty-cycle. The power limiter may be configured to dynamically adjust the first signal limit based on a comparison of the indication of the duty-cycle to a determined expected duty-cycle for a given level of regulated input signal. In some cases, the switching amplifier may be configured such that, in at least one amplifier operating mode, at least one of the switching voltages may be generated by a capacitive voltage generator of the switching amplifier.

In another aspect there is provided an amplifier apparatus for outputting an output signal based on an input signal comprising: an amplifier configured to receive an input supply voltage and to draw, in use, an amplifier input current resulting in an amplifier input power; and a power limiter configured to: monitor an indication of the amplifier input power; determine a first signal limit based on at least one of a pre-set limit of amplifier input current and a pre-set limit of amplifier input power and also based on an indication of the input supply voltage and one or more parameters of the set of load impedance, amplifier efficiency and temperature; and apply regulation to the input signal to provide a regulated input signal for input to the amplifier that does not exceed the first signal limit.

In a further aspect there is provided a method for signal-based limiting of output power for an amplifier comprising: monitoring an indication of an input supply voltage for the amplifier and an indication of an amplifier input current drawn in use; determining a first signal limit based on at least one of a pre-set limit of amplifier input current and a pre-set limit of amplifier input power and at least one of said indication of the input supply voltage and said indication of the amplifier input current; and regulating an input signal to provide a regulated input signal for input to the amplifier that does not exceed the first signal limit.

It should be noted that, unless expressly indicated to the contrary herein or otherwise clearly incompatible, then any feature described herein may be implemented in combination with any one or more other described features.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the disclosure relate to power limiting for amplifiers, in particular to the providing power control and/or limiting, for instance input current limiting. The amplifier power limiting can be suitable for switching amplifier and, in particular, for switching amplifiers operable with capacitive voltage generation, i.e., where at least one capacitor is used to generate a voltage that may be used as a switching voltage.

At least some embodiments relate to signal-based output power limiting for an amplifier. The signal-based output power limiting is used to reduce the loading requirements on the power supply input voltage for the amplifier and, as a result, maintain efficient and controlled operation of the amplifier. The signal-based output power limiting may be implemented to regulate, e.g., to attenuate, the amplifier's output signal in order to limit, control, or restrict the power supply input supply current provided to the amplifier and/or maintain the power supply consumption below a user configured threshold. This control may be implemented by modifying the original input signal so that when it is output from the amplifier, it only consumes the allowable amount of current or power, even if this modification results in reduced signal quality. In some embodiments, the signal-based output power limiting may adapt dynamically its limiting behaviour to track changes in the system operating conditions, for instance power supply input voltage, system efficiency, load impedance, and/or temperature. In this way, the signal-based output power limiting can enable the amplifier to maximize output signal delivery whilst staying within the limits of the current and power capacity of the system in which the amplifier is implemented.

Figure 1:
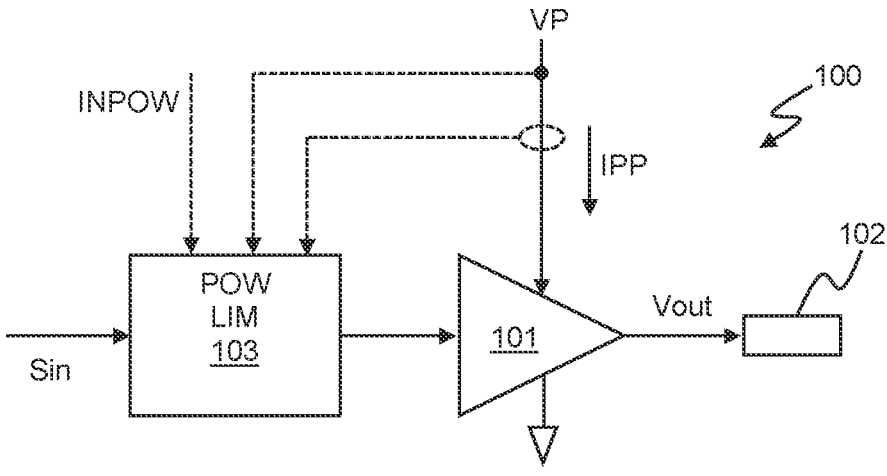
FIG. 1 illustrates an example of an amplifier circuit with signal based power limiting.

FIG. 1 illustrates one general example of an amplifier circuit 100 with a power limiter according to an embodiment. FIG. 1 illustrates an amplifier 101 for driving a load 102 with an output signal Vout based on an input signal Sin. In some applications the load 102 could be an output transducer, for instance an acoustic output transducer such as a loudspeaker of a host device of the driver apparatus or a speaker of an accessory device which may, in use, be removably connected to the host device, although in other applications the amplifier circuit may be used to driver other transducers, e.g. haptic output transducers such as linear resonant actuators or the like, or used for motor drive or the like.

The amplifier 101 is configured to receive an amplifier input supply voltage and in the example of FIG. 1, the amplifier 101 is connected to a supply voltage VP and ground and thus the amplifier input supply voltage is equal to VP, but it will be understood that other arrangements for voltage supplies, including split-rail supplies, may be possible. In use, the amplifier will draw an amplifier input current IPP. The input current IPP drawn by the amplifier 101 receiving the supply voltage VP results in a certain input power for the amplifier 101.

The amplifier 101 may be a switching amplifier, i.e., switched-mode amplifier, such as a class-D amplifier or the like, which is operable to switch at least one output node between different switching voltages with a controlled duty-cycle so as to provide the required output voltage (on average over the course of the switching cycle). In some examples, the switching amplifier 101 may include capacitive voltage generation, such as provided by a charge pump or similar, for generating an additional voltage (i.e., a voltage different to the supply voltage VP or ground) that can be used as a switching voltage. In some examples, the switching amplifier may be a multi-level switching amplifier in which the switching voltages can be selectively varied, e.g., in different operating modes.

The amplifier circuit 100 also comprises a power limiter 103 for providing output power limiting, so as to limit the input current and/or input power for the amplifier 101. The power limiter 103 receives the input signal Sin and, in the example of FIG. 1a also receives an indication of the input power for the amplifier 101. In some examples, the power limiter 103 may receive indications of the input voltage VP and input current IPP to the amplifier, which the power limiter 103 may monitor directly, although, in some examples, at least one of the input supply voltage VP and input current IPP may be monitored by some other monitoring block(s) and the monitored indications of input voltage VP and/or input current IPP provided to the power limiter 103. The indications of input supply voltage VP and input current IPP provide an indication of input power for the amplifier as will be readily understood by one skilled in the art. In some cases, however, the input power INPOW to the amplifier 101 may be determined by some other power monitoring block and supplied to the power limiter 103. The power limiter 103, as will be discussed in more detail below, applies regulation to the input signal Sin upstream of the amplifier 101 so as to limit the output signal from the amplifier 101 when required and prevent the input current or power of the amplifier from exceeding the defined limit. The power limiter 103 may, for instance, regulate the input signal by controlling at least one gain applied to the input signal Sin upstream of the amplifier 101. The power limiter 103 may comprise a compressor configured to apply compression to the input signal Sin upstream of the amplifier 101 when required. In some cases, a compressor, as will be understood by one skilled in the art, may apply selective gain control so that different signal components, e.g., different frequencies, may be subject to different gains. This can limit input power whilst minimising impact on the overall signal. The power limiter 103 may thus act to control a gain applied to at least part of the input signal so as to maintain input current and/or power within an acceptable range. The input signal for the amplifier 101 is thus the regulated input signal which is output from the power limiter 103 which thus may be modified compared to the original input signal, e.g., with an attenuation applied to part of the original input signal.

Figure 2A:
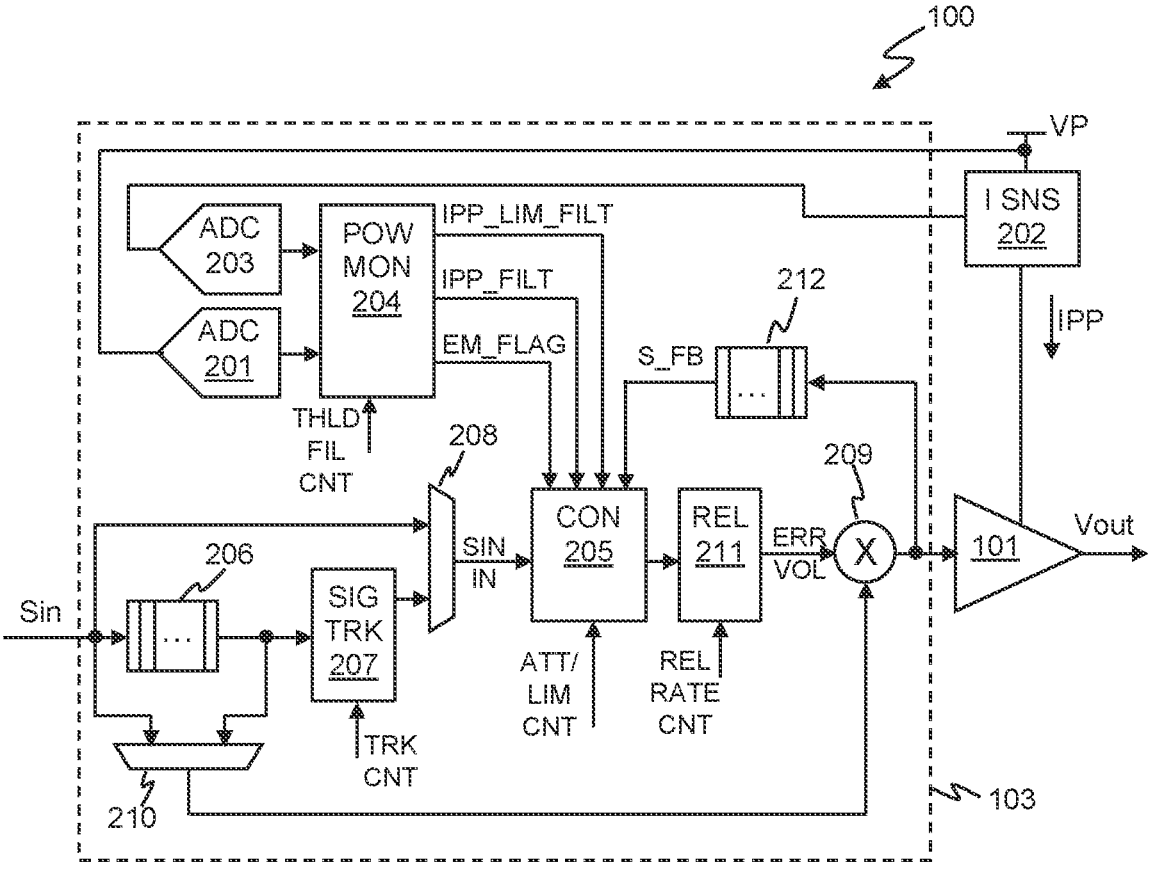
FIGS. 2a and 2b illustrate amplifier circuits with examples of a power limiter.

FIG. 2a illustrates one example of the amplifier circuit 100, which shows one example of the power limiter 103 in more detail. In this example, the power supply input voltage (VP) of the amplifier 101 is monitored by an analog-to-digital converter (ADC) 201 to provide an indication of the input voltage, VPMON. Similarly, the amplifier input current (IPP) is monitored by current sense circuitry 202 and ADC 203 to provide an indication IPPMON of the amplifier input current IPP. There are various ways that the amplifier input current IPP may be monitored, for instance by monitoring a voltage across a sense resistor, as will be understood by one skilled in the art. This allows improved current limiting operation as the actual amplifier input current is monitored and accordingly limited. The indications of input supply voltage and input current, VPMON and IPPMON, are provided to an input power monitoring block 204 for further processing, as will be discussed in more detail below.

A controller 205 receives an indication of the input signal Sin and determines whether to apply any limiting, e.g., whether to apply any signal compression, based on the monitored supply voltage and input current and a pre-set limit of acceptable input current or power.

In some cases, the input signal Sin may be supplied to the controller 205 via a buffer 206 and a signal tracking block 207. Use of these blocks allows more flexibility for the input signal to the amplifier to be shaped during the limiting response due to the look ahead effect of the system created by the buffer 206. However, the use of the buffer 206 and the signal tacking block 207 will add to the latency associated with the power limiter 103 and thus these functions may be omitted in some implementations. FIG. 2a illustrates an example in which a selector 208 can selectively provide an input to the controller 205 from a path that includes buffer 206 and signal tracking block 207 or from a bypass path that bypasses the buffer 206 and signal tracking block 207. The bypass path can be selected for some applications and/or use cases to provide a lower latency. Various aspects of the signal tracking may be configurable via a TRK CNT control input.

The controller 205 operates to dynamically determine at least one signal limit at which to apply limiting to the input signal Sin so as to maintain the input current and/or power for the amplifier 101 below a pre-set value. The controller 205 dynamically determines the at least one signal limit based on the monitored input voltage VPMON and/or monitored input current IPPMON and resultingly the monitored input power. The controller 205 may also determine the at least one signal limit based on one or more parameters such as one or more parameters comprising a first set of amplifier/system efficiency, load impedance, amplifier gain and/or temperature.

The controller 205 may advantageously determine a first signal limit as a hard signal limit and at least a second limit as a soft signal limit. The controller 205 may be configured to apply limiting, e.g., compression, so that no signal peak of the regulated input signal exceeds the hard signal limit. A soft signal limit may be of lower magnitude than the hard signal limit and may be used as the signal limit at which the controller 205 starts to apply some gain modification, e.g., attenuation/compression. This may allow for a more gradual application of compression as the input signal approaches the hard signal limit which can be better for distortion performance.

The pre-set limit may, in some examples, be a limit (IPP_LIM) of input current. In this case, the controller 205 may establish a voltage domain hard signal limit based on the measured input power data using the measured VPMON and IPPMON data and user configurations such as initial system efficiency estimate, the initial amplifier's load impedance estimate, and the amplifier's analog gain. The hard signal limit is set, based on these parameters, so that a regulated input signal to the amplifier at the hard signal limit should lead to an amplifier input current draw no greater than the input current limit. The controller 205 may then estimate a voltage domain soft signal limit, for instance using a user configured soft-scaling factor (SFT_SCALE) and determine whether a soft-clipping or hard-clipping response should be applied to the input signal Sin upstream of the amplifier. The clipping response may be applied via manipulation of a control signal (ERR_VOL) that controls a gain applied to the input signal Sin, e.g., to attenuate the input signal, for example by a gain multiplier 209. The gain multiplier 209 may act on the input signal Sin, which may, in some examples, be selected by a selector 210 to be the received input signal Sin or the signal output from the buffer
206 if used so that the gain control is correctly timed with
respect to the input signal.

The control signal ERR_VOL may be generated so as to
start to attenuate the input signal when the soft signal limit
is reached and to increase the extent of attenuation as the
difference between the attenuated or compressed input sig-
nal and the hard limit decreases. In this way, the controller
205 regulates the input signal Sin based on these established
voltage limits, the current loading is controlled and the input
current IPP is kept below the current limit.

In other implementation examples, a user set power limit
may be used instead of a pre-set current limit and used to
determine appropriate hard and soft signal limits, or there
may be limits for both input current and power and the
controller may determine appropriate hard signal limits for
both and implement control based on whichever hard signal
limit is the lower magnitude. Also, in some implementa-
tions, more signal limits may be determined, e.g., more than
one soft signal limit could be determined for applying
increasing amounts of compression.

Figure 2B:
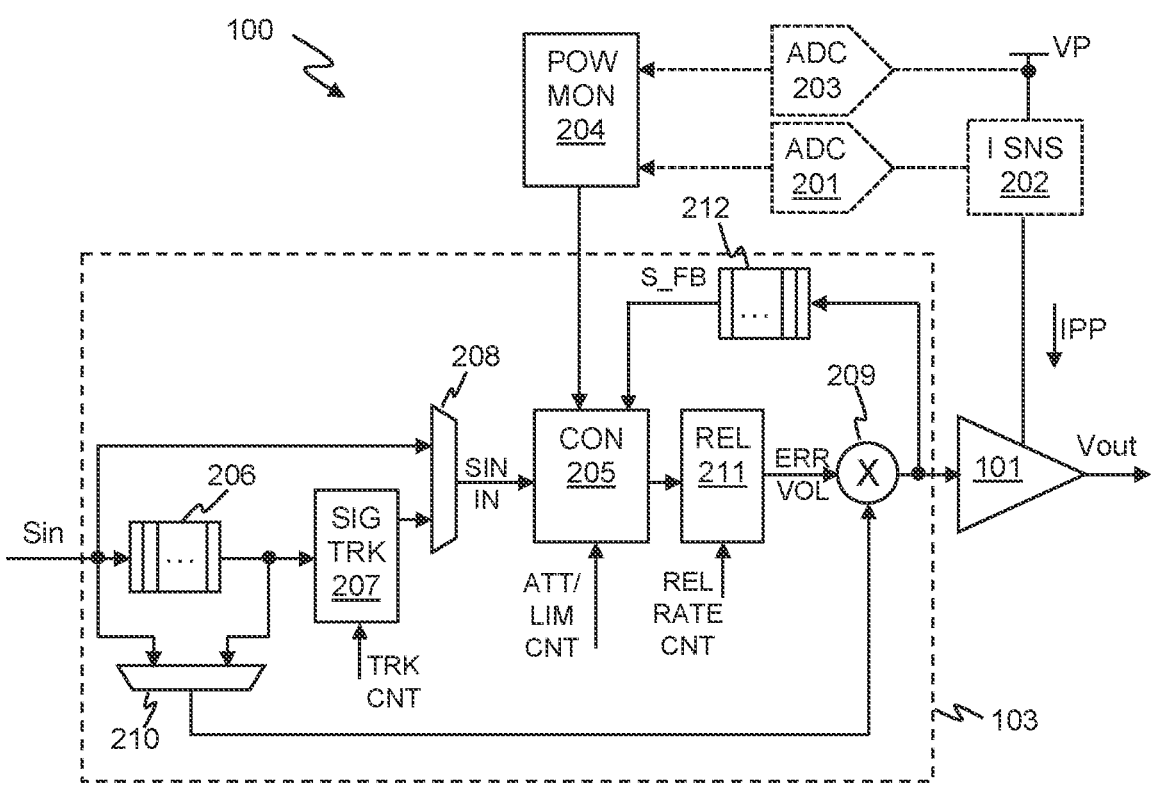

FIG. 2*a* illustrates an example in which the power limiter
103 includes ADCs 201 and 203 for monitoring the input
supply voltage VP and input current IPP for the amplifier
101. In some cases, however, at least one of the input supply
voltage VP and amplifier input current IPP could be moni-
tored by some other functional block(s), i.e. the ADCs 201
and/or 203 could be implemented as part of, and/or shared
with, some other circuitry. For instance, it may be desirable
to monitor the input supply voltage VP and/or the amplifier
input current IPP for other reasons and thus a monitor for the
input supply voltage and/or a monitor for the input current
IPP may typically be implemented in at least some prior
amplifier circuit designs. In which case, the power supply
monitor 204 may be configured to receive an indication of
the input supply voltage VP and/or input current IPP from
such monitors as would ordinarily be present. In some cases,
the power limiter 103 could receive an indication of deter-
mined input power from some other functional block, i.e. an
indication of the actual input power as calculated or other-
wise determined. FIG. 2*b* shows another example of the
amplifier circuit 100, which is similar to that illustrated in
FIG. 2*a*, but wherein the power limiter 103 is configured to
receive an indication of determined input power from a
power monitor 204 which may be implemented as at least
part of some other functional block.

Figure 3:
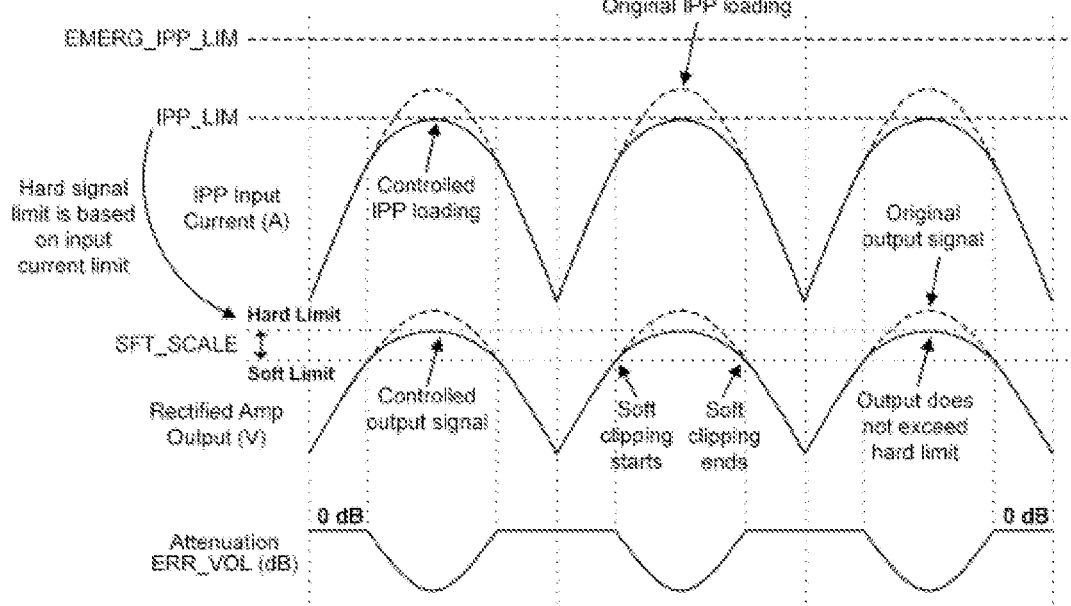
FIG. 3 illustrates an example soft limiting response of the power limiter.

FIG. 3 illustrates an example of the soft-clipping response
of the power limiter 103. FIG. 3 illustrates plots of three
example waveforms over time. The top waveform illustrates
the amplifier input current IPP, the middle plot illustrates the
amplifier output signal Vout (rectified for ease of display),
and the lower plot illustrates the control signal ERR_VOL
for controlling the attenuation applied to the input signal
upstream of the amplifier. The dashed lines indicate the input
current demand and output voltage for the original signal
without any attenuation or compression and it can be seen
that the input current demand based on the unmodified input
signal would, in this example, result in the pre-set current
limit IPP_LIM being exceeded. The solid lines indicate the
attenuation applied by power limiter 103 via the control
signal ERR_VOL and the resultant input current demand
and output voltage based on the regulated input signal. The
hard signal limit (which corresponds to the hard signal limit
applied for the input signal) is determined as described
above based on the pre-set input current limit IPP_LIM and
various system parameters, and the soft-signal limit is scaled
with respect to the hard signal limit by an amount determined by the scaling factor SFT_SCALE. To avoid exceed-
ing the pre-set current limit IPP_LIM, the controller 205
starts to apply attenuation to the input signal, and hence also
the output signal, at the soft signal limit via the ERR_VOL
control signal. The amount of attenuation is increased until
reaching the hard signal limit. In this way, the output signal
is properly regulated between the soft- and hard-signal
limits, and the input current IPP loading is controlled so as
to not exceed the pre-set current limit IPP_LIM. Once the
signal level of the input signal Sin decreases, the amount of
attenuation or compression applied can be reduced until at
the soft signal limit there may be no attenuation or com-
pression.

When releasing the control signal ERR_VOL from higher
attenuation to lower attenuation, the power limiter 103 may,
in some cases implement a release rate through a release rate
controller 211. This release rate control may effectively
function as a time-based hysteresis to limit rapid jumps in
attenuation and ensure a softened release response. The
release rate may be configurable by a user through a control
input (REL RATE CNT). For these examples, a 2-limit
system (hard and soft signal limits) is described, but addi-
tional limits may be included for various signal or power
shaping purposes.

The power limiter 103 may be configured to detect a first
error condition if the power supply input current or input
power exceeds the set current or power limit respectively
and corrects this error condition by updating the voltage
domain signal limits.

Figure 4:
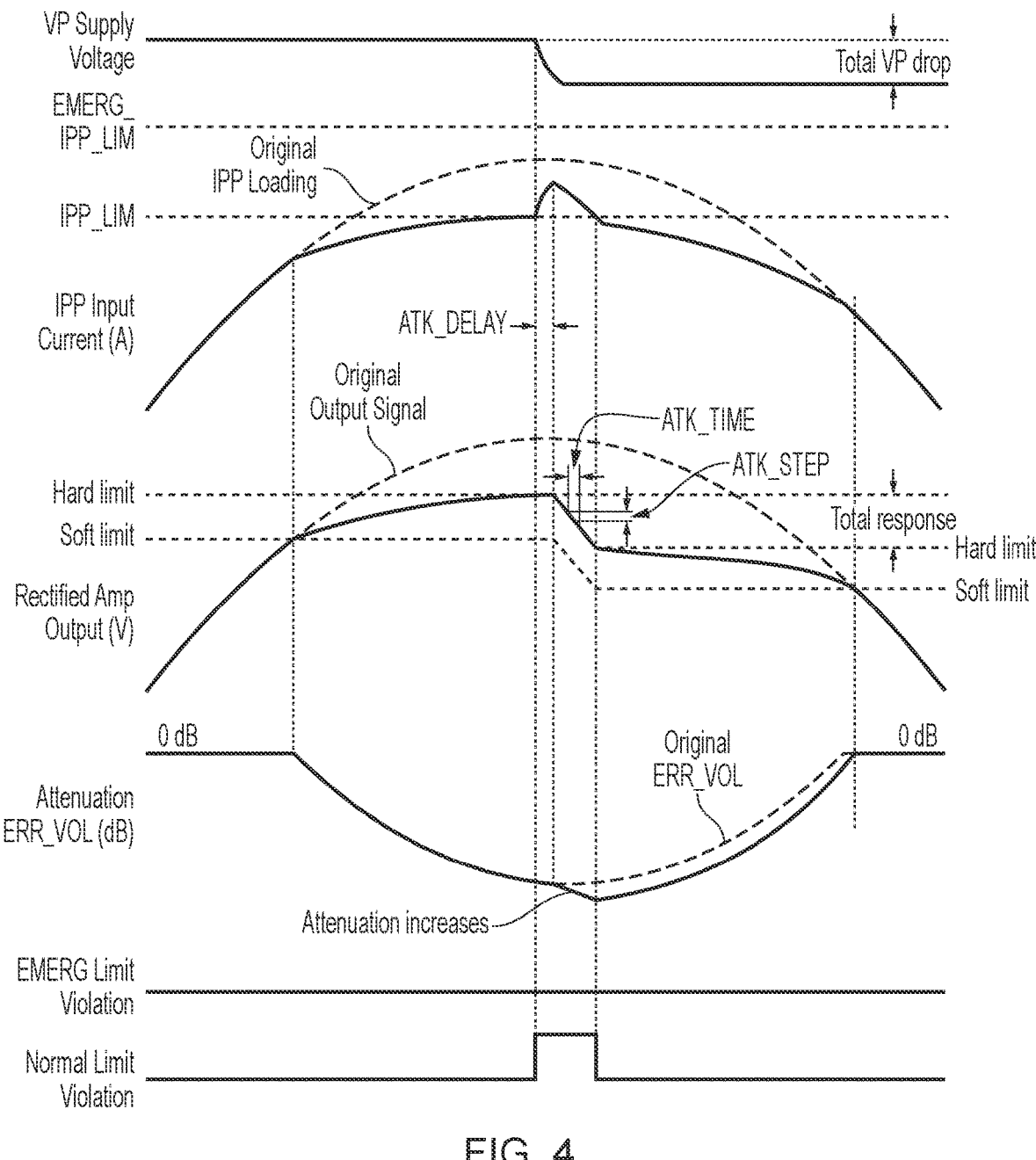
FIG. 4 illustrates an example of a response of the power limiter to a normal current limit being exceeded.

FIG. 4 illustrates one example of an error response of the
power limiter to a first error condition. Like FIG. 3, FIG. 4
illustrates waveforms plots over time showing the input
current for the amplifier and the output signal (rectified),
with dotted lines indicating the input current demand and
output voltage for the original signal without any attenuation
or compression, and the control signal ERR_VOL. FIG. 4
also illustrates, at the top, the input supply voltage VP and,
at the bottom, two further control signals for flagging what
are termed herein a normal limit violation and an emergency
limit violation.

In this example, the power limiter 103 starts to apply
attenuation to the input signal, and hence the output of the
amplifier 101, when the soft signal limit is reached. How-
ever, the example of FIG. 4 illustrates a drop in the supply
voltage VP during the period in which attenuation is being
applied. With the reduced input supply voltage VP, the
amplifier input current IPP necessary to deliver the same
amount of power increases and thus the result is that the
amplifier input current IPP exceeds the current limit (IP-
P_LIM). This may cause the power limiter 103 to flag a
normal limit violation and thus the relevant control signal
goes high. It will be noted that FIG. 4 illustrates an example
of an error condition caused by a drop in the supply voltage
VP, but that other changes in operating conditions could also
lead to a similar error condition and lead to a similar error
response.

In this example, as a possible way to correct the error
condition, the power limiter 103 determines whether the
error condition lasts longer than a defined delay time,
ATK_DELAY, which may be a user configurable delay time,
and if the level of the input supply voltage VP is equal to or
lower than its value before the over-limit condition. If so, the
power limiter 103 may be configured to reduce the hard
signal limit and, in turn, apply additional attenuation via the
ERR_VOL control signal. In some implementations the
hard-signal limit may be reduced in a series of discrete levels
(ATK_STEP) and time steps (ATK_TIME) and the additional attenuation via the control ERR_VOL may be implemented with a defined slew-rate, which may be user configurable. Alternatively, the hard signal limit may be reduced based on the error between the input current limit IPP_LIM and measured input current IPP using for instance a Proportional Integral (PI) controller, which drives this error to zero, or by calculating the hard signal limit based on the amount of this error, or by using pre-calculated hard signal limit based on the amount of this error. The soft signal limit(s) is/are determined based on the hard signal limit and thus also reduce accordingly. The hard and soft signal limits may then be maintained at the new reduced levels because of the error condition correction until updated by the dynamic adaptation or because they are changed because of another current limit violation.

It will be noted that were the input supply voltage VP to rise during a period in which attenuation was being applied to the input signal (and the input current IPP is at or near the current limit), the rise in VP could result in the amplifier input current crossing the current limit—however this would only lead to a temporary excursion above the current limit. In this case, as the level of the input supply voltage VP will be determined to be higher than before the limit violation, no additional attenuation may be applied for this error condition.

Figure 5:
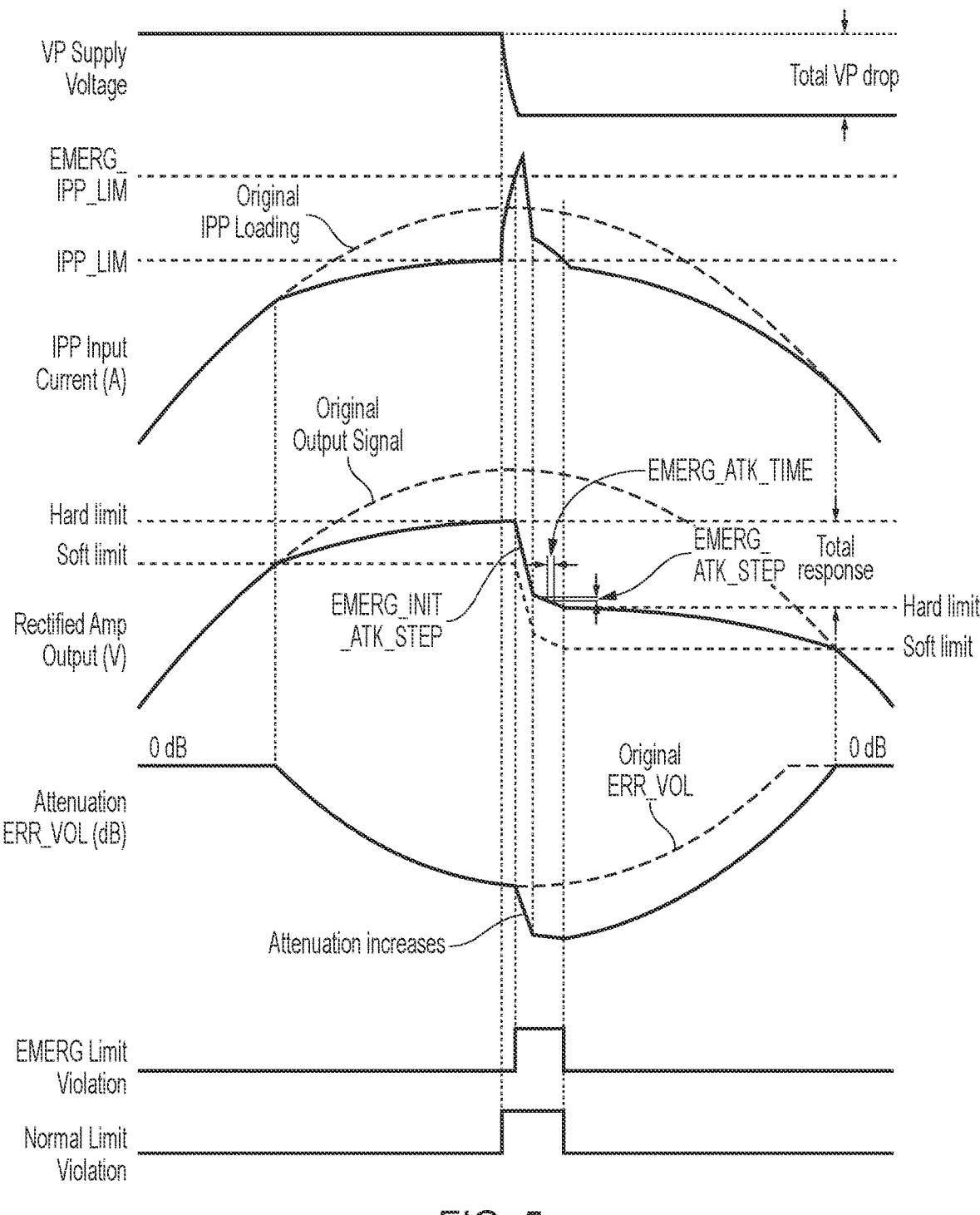
FIG. 5 illustrates an example of a response of the power limiter to an emergency current limit being exceeded.

In some implementations, as well as the current limit IPP_LIM, which may be regarded as the normal current limit, there may be an additional higher limit (EMERG_IPP_LIM), which can be seen as a maximum or emergency limit of input current at which more aggressive attenuation may be applied. In some cases, the emergency limit EMERG_IPP_LIM may be user configurable. FIG. 4 illustrates an example where the normal current limit IPP_LIM is exceeded, leading to an error response, but the emergency limit EMERG_IPP_LIM is not violated. FIG. 5 shows similar plots as FIG. 4 but illustrates an example of a response when the emergency limit EMERG_IPP_LIM is exceeded, which corresponds to a second error condition.

In the example of FIG. 5, attenuation is applied when the soft signal limit is reached. In this example, however an abrupt and large drop in the input voltage VP occurs while attenuation is being applied. This initially causes the input current IPP to exceed the normal input current limit IPP_LIM, which causes the normal limit violation flag to be generated which would trigger the normal error response for a first error condition as described with reference to FIG. 4. However, in this case the input current IPP rises to the emergency threshold EMERG_IPP_LIM, which causes the emergency limit violation flag to be generated, indicating a second error condition. This results in an instantaneous reduction of the hard signal limit (and hence also the soft limit(s)), i.e., without waiting for the attack delay period ATK_DELAY. The hard limit may be reduced by a defined amount, EMERG_INIT_ATK_STEP, which may be user configurable. If the input current IPP is still over the normal current limit IPP_LIM after the initial attack, a repeated attack behaviour may be implemented to repeatedly reduce the hard signal limit to apply additional attenuation via the control signal ERR_VOL until the emergency condition clears. The attack properties for the emergency limit violation response, such as the step size and period (EMERG_ATK_STEP and EMERG_ATK_TIME) may be user configurable. The emergency limit violation condition may only clear after the input current IPP falls below the normal current limit IPP_LIM, not the emergency limit. In general, therefore the response to the second condition, in terms of updating the hard and soft signal limits, may be more rapid than the response to the first error condition. One skilled in the art will understand that the same principles could be used to provide tiered responses or responses with different types of behaviours and/or priorities. Again, it will be noted that FIG. 5 illustrates an example of an error condition caused by a drop in the supply voltage VP, but that other changes in operating conditions could also lead to a similar error condition and lead to a similar error response.

In some implementations, the input power monitoring block 204 of FIG. 2 may be configured to monitor the amplifier input current and/or power against the defined input current and/or power limits and the supply monitoring block may provide one or more of the error flags mentioned above to the controller 205. The controller 205 may be configured to determine the hard and soft limits and control the attenuation applied. It should be understood that these functions are illustrated separately for clarity of explanation, but these functions could be combined into a single functional block that receives the input signal, the monitored input current and input voltage and any additional user parameters and controls the limiting accordingly. Various aspects of operation of the input power monitor 204 and the controller 205 may be set by appropriate control inputs (illustrated as THLD FIL CNT and ATT/LIM CNT).

In at least some embodiments, the power limiter 103 may be configured to dynamically adapt its voltage domain limiting behaviour, i.e., the setting of the hard signal limit, based on changes in the system operating conditions, such as variations in the power supply input voltage VP, load impedance (RLOAD), system efficiency (EFF), configuration changes by the user, and temperature. Such changes may result in changes in the available output power that may be delivered to the load.

For example, consider that the hard and soft signal limits are determined appropriately for a first set of operating conditions. A decrease in any of the input voltage VP, load impedance RLOAD, or system efficiency EFF, e.g., the efficiency of the amplifier 101, can mean that less output voltage can be applied to the load for a set input current limit. In this case, the previously determined hard and soft signal limits may no longer be appropriate, and the input signal to the amplifier maybe under attenuated for the previously determined hard and soft signal limits, which may result in the current limit IPP_LIM being violated. Similarly, if there were an increase in any of the input voltage VP, load impedance RLOAD, or system efficiency EFF, more output voltage can be applied to the load for a configured current limit and using the previously determined hard and soft limits could result in over limiting of the input signal as delivered to the amplifier, which is detrimental for performance.

Therefore, in at least some embodiments, the power limiter 103 may track any variations in one or more operating parameters or conditions and dynamically adapt the hard and soft signal limits accordingly. In this way, it enables the system power output to be pushed closer to the limit of available input power while keeping the consumed input current IPP or input power below the set current or power limit. In other words, the available system power usage is optimized.

In some implementations, to avoid a risk of introducing artifacts into the output signal due to adaptations, the hard and soft limits may only be updated dynamically in response to at least some parameters when no attenuation is being applied to the input signal based on those hard and soft signal limits. This manner of updating means that there may effectively be "safe" times to make parameter updates and "unsafe" times to make parameter updates. The type of system (e.g., audio, haptic, motor driver, etc.) may also be taken into account when determining at what times or available windows to make updates, as controlling the signal accurately for a given loading cycle may take priority over optimizing the power for that particular loading cycle.

In some examples, the power limiter 103 may be configured to dynamically update the hard and soft signal limits for changes in the supply voltage VP in a substantially continuous manner when attenuation is not being calculated and applied, e.g., when the input signal is below the present soft signal limit. If the supply voltage VP decreases when attenuation is being applied, the power limiter 103 may be configured to respond immediately and may recalculate the signal limits accordingly. Using small steps in audio attenuation that are quickly updated allows the output signal to be reshaped while limiting distortion or discontinuities. If, instead, the supply voltage VP increases when attenuation is being applied, this means more available power that may be delivered to the load. The power limiter 103 may be configured such that if the input voltage VP stays at this increased level longer than a predetermined hold time (VP_HLD_TIME), which may be user configurable, the power limiting may start tracking the increasing input voltage VP level and updating the signal limits accordingly. If the input supply voltage VP then falls below this higher level, the level of the input supply voltage VP being used for calculations may be updated and the predetermined hold time VP_HLD_TIME may be reset. It will be understood however that different implementations may implement different combinations of immediate or delayed responses to certain changes in supply voltage VP.

In some implementations, the dynamic adaption for variations in load impedance RLOAD and/or system efficiency EFF may be performed continuously or periodically as needed.

In some implementations, the dynamic adaption for variations in load impedance RLOAD and/or system efficiency EFF may be based on a feedback signal. For instance, referring back to FIG. 2a, the input signal after any attenuation applied by the control signal ERR_VOL may be fed back to the controller 205, possibly through a feedback buffer 212. This feedback signal, S_FB, is a representation of the amplifier's output signal seen on the load. The amplifier delay can be compensated by the feedback buffer 212 to align the feedback signal S_FB with the signals IPPMON and VPMON indicative of the input current and input voltage. In this way, the input current IPP drawn by the load for a given amplifier output amplitude and at a given VP voltage level is known. The controller 205 of the power limiter 103 can use these data points to estimate present value of load impedance RLOAD and system efficiency values and accordingly update the hard and soft signal limits to match the real operating conditions. After the system has adapted, the default initial estimates of load impedance and system efficiency estimate values can be ignored in the signal limit calculation.

Dynamic adaptation for operating condition changes may also be performed based on the error between the input current limit (IPP_LIM) and measured input current (IPP). As noted above, the amplifier delay may be compensated by the feedback buffer 212, so as to align the feedback signal S_FB with the monitored indication of input current IPPMON.

In which case, the monitored input current IPPMON may preferably reach the level of input current limit (IPP_LIM) when the S_FB data is at the hard signal limit. At this point or within a set range of hard signal limit, if the monitored input current IPPMON is lower than the current limit IPP_LIM, at least the hard signal limit may be increased, for instance using a proportional-integral (PI) controller, until the error between the input current limit IPP_LIM and monitored input current IPPMON is zero. The PI controller may have one or more proportional gain parameters and one or more integral gain parameters. Similar operation can be performed for IPPMON data larger than the IPP_LIM to reduce the signal limits. Adjusting the hard and soft limits in this way can ensure appropriate limiting is applied, without over and under limiting.

For a closed-loop switching amplifier, dynamic adaptation for variations in RLOAD and EFF may also be performed based on the modulation index or switching duty cycle of the amplifier. As discussed above, for a switching amplifier one or more output nodes (depending on whether the load is connected in a single-ended or bridge-tied-load configuration) may be switched between defined switching voltages with a controlled duty-cycle so as to generate the required output voltage (on average over the course of the switching cycle of the switching amplifier). The duty-cycle or modulation index can be seen as the voltage demand of the amplifier. For a closed-loop switching amplifier, the input signal may be combined with a feedback signal from the amplifier and used to determine the required duty-cycle as will be understood by one skilled in the art. Thus, the duty-cycle or modulation index thus encodes information about the load impedance RLOAD and system efficiency EFF. In some implementations, the expected modulation index or duty cycle for the signal limits may be estimated based on the present values of load impedance RLOAD and system efficiency EFF, which initially may be some default assumed values. The expected modulation index or duty cycle may be compared with the actual modulation index or duty cycle derived by the closed loop feedback within the switching amplifier. If the load impedance RLOAD and/or system efficiency EFF change, the actual modulation index or duty cycle may deviate from the expected one, and the signal limits can be updated according to the amount of this deviation, effectively compensating for errors in or changes to the system. After the system has adapted, the default initial estimates of load impedance and system efficiency estimate values can be ignored in the signal limit calculation. For a multi-level switching amplifier, where the switching voltages used may be different in different modes, the modulation index will also depend on the relevant operating mode and thus controller 205 may also take the operating mode into account.

Dynamic adaptation for variations in the system efficiency EFF may additionally or alternatively be performed by using expected efficiency values at different system operating points through a feedforward path, i.e., by using predetermined expected values of efficiency for different possible operating conditions. In one example, the feedforward path may include a look-up table that includes expected efficiency values with respect to one or more of input signal level, input voltage VP level, load impedance RLOAD and/or temperature. These expected efficiency values may then be used to update the voltage domain signal limits.

Dynamic adaptation for variations in load impedance RLOAD may additionally or alternatively be made based on measurements of the load impedance, for instance based on a measurement of DC load resistance. For instance, the amplifier output voltage Vout and output current may be measured, and the measured output voltage divided by the output current to calculate a value of load impedance RLOAD.

Figure 6:
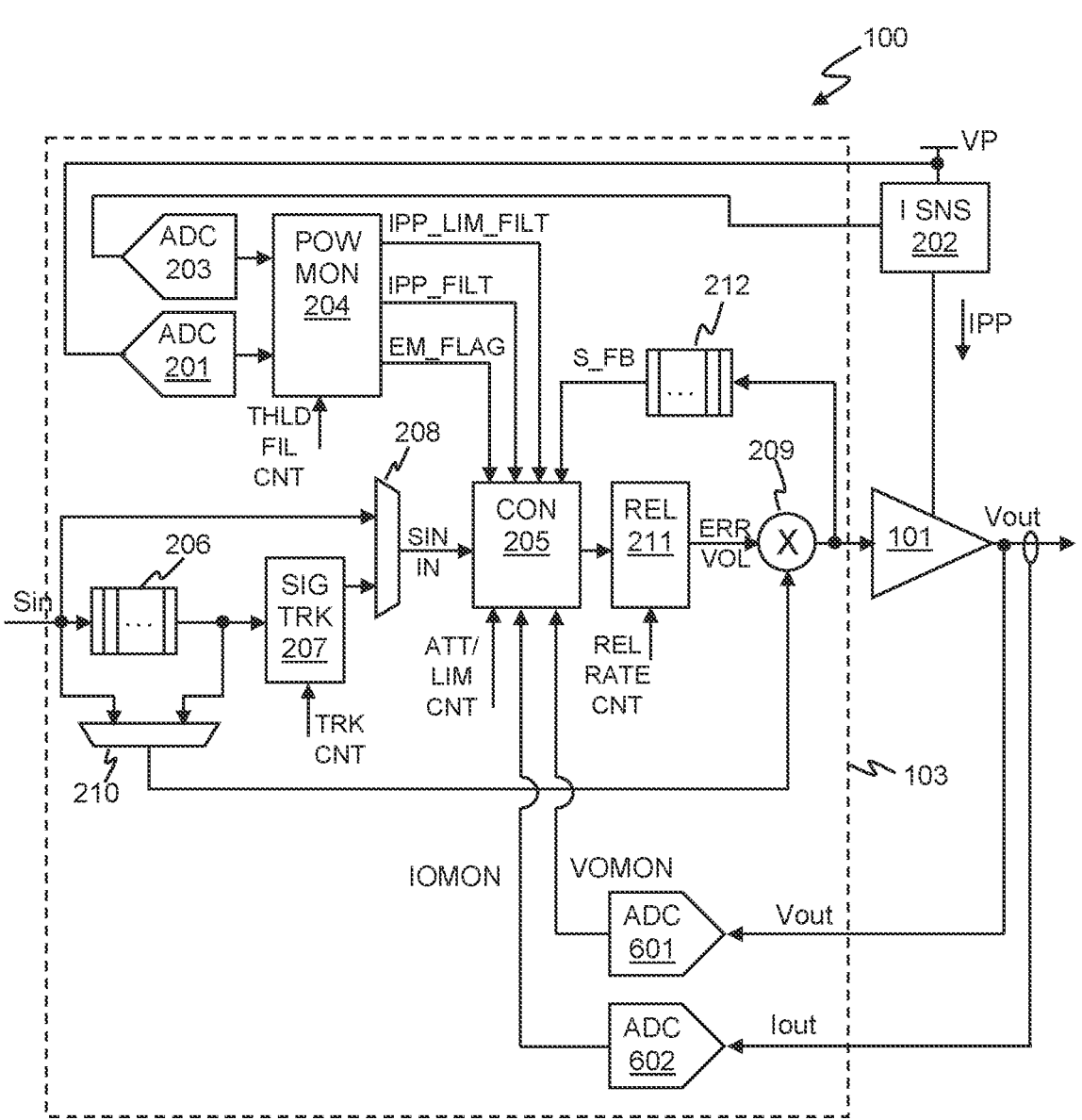
FIG. 6 illustrates an amplifier circuit with another example of a power limiter.

FIG. 6 illustrates an example of an amplifier circuit 100 in which similar components as those discussed with respect to FIG. 2*a* are identified by the same reference numerals. The power limiter of FIG. 6 includes an ADC 601 for monitoring the output voltage Vout from the amplifier to provide an indication VOMON of the output voltage. An ADC 602 monitors the output current and provides an indication IOMON of the output current. There are various ways that the output current may be monitored, for instance by monitoring a voltage across a sense resistor as will be understood by one skilled in the art. It will be noted that in many conventional implementations of amplifier circuitry it may generally be desirable to monitor the output current and voltage and the current and voltage monitoring ADCs 601 and 602 may thus typically be present in a conventional amplifier circuit. The current and voltage monitoring ADCs 601 and 602 may therefore be shared with other control functions and may not represent any additional circuit overhead in terms of area or bill of materials for the power limiter 103.

In the example of FIG. 6, the indications VOMON and IOMON of amplifier output voltage and current may be provided to the controller 205 which may calculate the load impedance by dividing VOMON by IOMON. The voltage domain hard and soft signal limits may then be set using this calculated load impedance RLOAD and may then be dynamically adapted according to the changes in the monitored load impedance RLOAD. Additionally, or alternatively, the controller 205 may calculate and dynamically adapt a value of the system efficiency EFF using a ratio between the output power and the input power. In this example, the output power may be calculated by multiplying the VOMON data by the IOMON data, and the input power may be calculated by multiplying the VPMON data by the IPPMON data. The voltage domain hard and soft signal limits may then be set using this calculated system efficiency EFF and may be dynamically adapted according to the changes in the monitored system efficiency EFF. Dynamic adaptation according to RLOAD and EFF calculations may be done separately or together in other examples.

Figure 7:
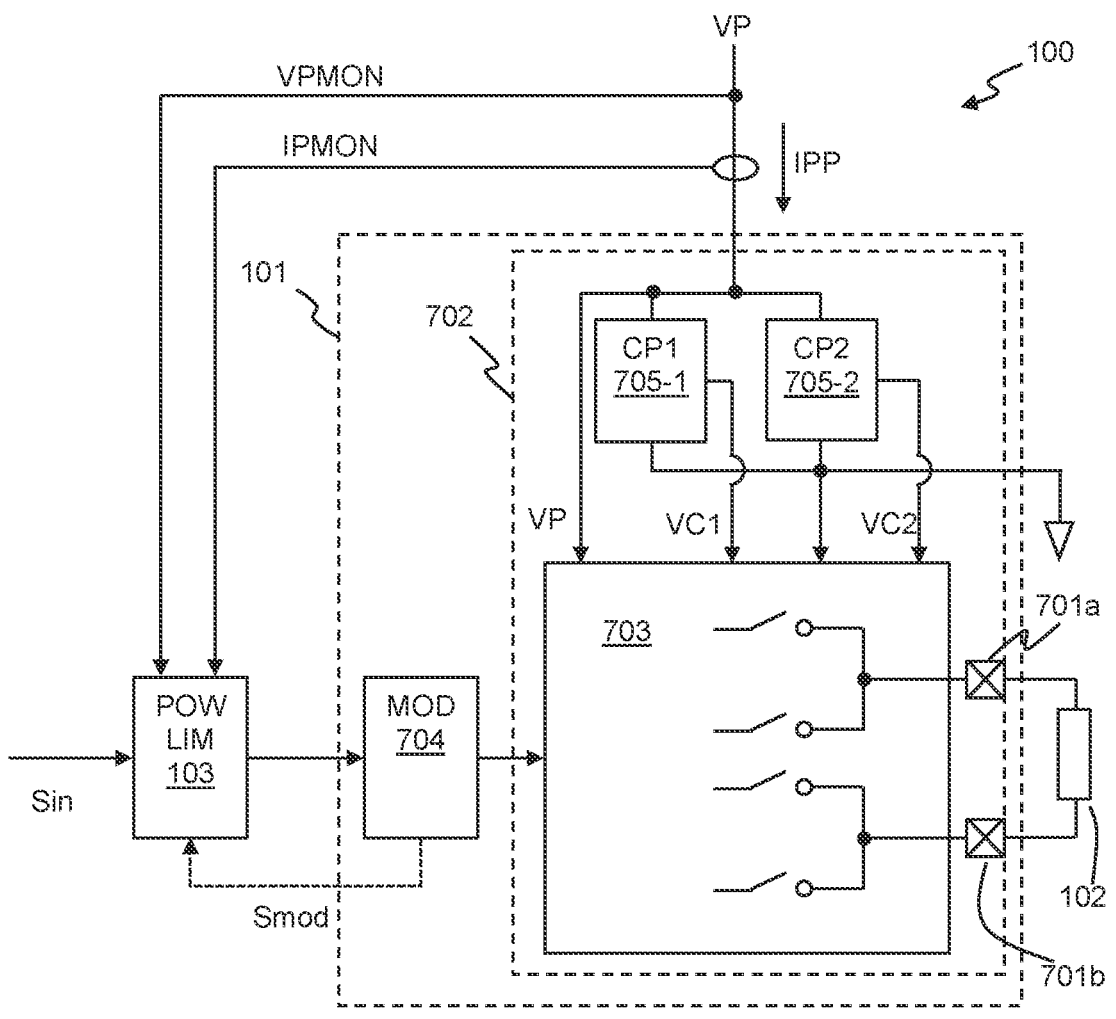
FIG. 7 illustrates an example of a power limiter implemented with a switching amplifier.

As noted above, the amplifier 101 may, in some implementations be a switching amplifier. FIG. 7 illustrates another example of an amplifier circuit 100, showing one example of a possible amplifier in more detail. In the example of FIG. 7, the amplifier 101 is a switching amplifier, e.g., a switched mode driver. The amplifier 101 in the example of FIG. 7 is configured to be operable to drive the load in a bridge-tied-load (BTL) configuration, and thus the load 102 is connected, in use, between respective output nodes 701*a* and 701*b* of the switching amplifier 101 such that each side of the load can be driven with a respective drive signal based on the input signal Sin so as to generate a desired differential output signal across the load 102. In some cases, however, the switching amplifier 101 could be configured to drive the load 102 in a single-ended fashion, where only one side of the load is driven with a drive signal based on the input signal Sin and the other side of the load 102 is held at a fixed DC voltage.

A stage 702 of the switching driver 101, which will be referred to herein as a power stage, comprises a switch network 703 of switching paths that can be controlled so as to switch the output nodes 701*a* and 701*b* between different switching voltages. It will be understood that FIG. 7 generally illustrates just some switches of a possible switch network 702 and that there are various different arrangements of switches that could be implemented, depending on the application. For example, U.S. Pat. No. 11,277,128 and US2022/0376618 describe examples of switched mode drivers. A modulator 704 controls the operation of the switch network 704 so as to modulate each of the output nodes 701*a* and 701*b* between the relevant switching voltages with a controlled duty cycle so as to generate the respective driver signal for that output node based on the input signal Sin.

In at least some embodiments, the power stage 702 of the switching amplifier 101 also comprises at least one capacitive voltage generator for generating an additional voltage, which is different to supply voltages VP and ground, and which can, in at least one operating mode of the switching amplifier, be used as a switching voltage by the switching amplifier, i.e., by the power stage 702.

A capacitive voltage generator receives input voltages, such as the supply voltage VP and ground (and/or, in some cases, a voltage output from another capacitive voltage generator), and is operable so that at least one flying capacitor (not separately illustrated in FIG. 7) can be connected, in a charging state, to be charged by the input voltages for that capacitive voltage generator, and can then be connected, in an output state, with one of the input voltages to provide an output voltage which is level shifted from that input voltage.

In the example of FIG. 7, a first capacitive voltage generator 705-1 receives the supply voltages VP and ground and generates an output voltage VC1, which may, for example, correspond to the supply voltage VP positively boosted by the input voltage, so that VC1=2VP. A second capacitive voltage generator 705-2 receives the supply voltages VP and ground and generates an output voltage VC2, which may for example correspond to ground negatively boosted by an amount equal to the input voltage, so that VC2=−VP. In some cases, at least one of the capacitive voltage generators 705 may comprise a charge pump which operates, in use, with at least one hold or reservoir capacitor (not separately illustrated) at the output of the charge pump to maintain the output voltage of the charge pump. In such a case, the output voltage of the charge pump may be maintained in a substantially constant manner when the charge pump is active, with only a certain voltage ripple due to the switching cycle of the charge pump—and the switching cycle of the charge pump may be independent of the switching cycle of the modulation of the output nodes 701*a* and 701*b*. In some cases, however, the capacitive voltage generator may not operate with a hold capacitor and may generate the relevant output voltage for only part of the switching cycle as required for modulation of the output nodes.

In the example of FIG. 7, the switching amplifier 101 is a multi-level switching driver which is operable so that switching voltages which the output nodes 701*a* and 701*b* are switched between can be selectively varied in use. The switching voltages may be selected from the supply voltages, i.e., VP or ground, and also from the generated voltages VC1 and VC2. In the example, described above, the switching voltages may be selected from any of +2 VP, VP, 0V or −VP. The switching amplifier 101 may be operable in a variety of different operating modes where the switching voltages are different in the different mode. For example, the switching amplifier 101 could be operated in a first mode, which can be seen as a low signal level mode, in which both output nodes 701*a* and 701*b* are modulated between the supply voltages, VP and ground, to generate a differential output signal, of either polarity, with a magnitude of up to VP (on average over the course of the switching cycle). The switching driver 101 could also be operated in a second mode, which can be seen as an intermediate signal level mode, in which one of the driver output nodes 701*a* or 701*b* (depending on the required polarity of the output signal) is modulated between the boosted voltage +2 VP and the supply voltage VP, whilst the other driver output node is modulated between the supply voltages, VP and ground, to generate a differential output signal across the load of a magnitude up to 2 VP. In an alternative second mode, the same output range could be generated by instead switching one driver output node between the supply voltages VP and ground, whilst switching the other output node between ground and the boosted voltage −VP. A third mode, which can be seen as a high signal level mode, may involve one driver output node (depending on the required polarity of the output signal) being modulated between the boosted voltage +2 VP and the supply voltage VP, whilst the other driver output node is modulated between the ground and the boosted voltage −VP, to generate a differential output signal across the load of a magnitude up to 3 VP.

It should be noted that whilst the capacitive voltage generator(s) may be used for voltage boosting or step-up operation, i.e. to provide level shifting of a voltage to provide a voltage of a higher magnitude (whether positive boosting or negative boosting), in some applications at least one capacitive voltage generator may be configured to provide a voltage of a lower magnitude, e.g. to provide a buck or step-down operation which may provide a voltage with a magnitude which is a fraction of that of the input voltage.

The modulator 704 is configured to control the mode of operation of the power stage 106 of the switching amplifier and also a duty cycle of modulation of the driver output nodes in the relevant mode, which in some cases may involve control over at least one of the capacitive voltage generators 705, e.g., to enable or disable the capacitive voltage generator and/or control a duty-cycle or switching frequency. In some implementations the modulator 704 may be configured for closed-loop operation and may thus receive a feedback signal of the output Vout. In some implementations, a signal Smod indicative of the duty-cycle and mode of operation of the power stage 702 may be provided to the power limiter 103 to allow for adaptation of the hard and soft limits as discussed above.

Embodiments of the present disclosure thus provide a power limiter that applies signal based power limiting for an amplifier and which can be suitable for a switching amplifier. The power limiter may determine at least one signal limit based on a pre-set limit of input current or power. The power limiter may, for instance, set a hard signal limit and apply limiting to the input signal so as to not exceed the hard signal limit. The power limiter may also determine at least one soft limit at which to start to apply limiting. In at least some implementations, the hard and soft limits may be dynamically adjusted in use, based on operating conditions, which can improve performance, in that the limits can be set to enable operation up to, but not exceeding the current or power limit without over-limiting.

Figure 8:
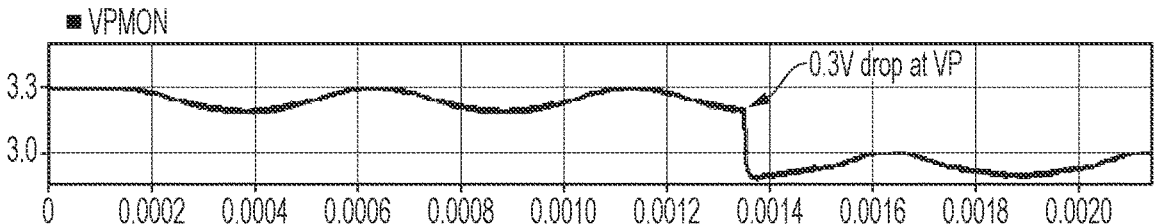
FIG. 8 illustrates a simulated response of an amplifier circuit with a signal limiter according to an embodiment.
Figure 8:
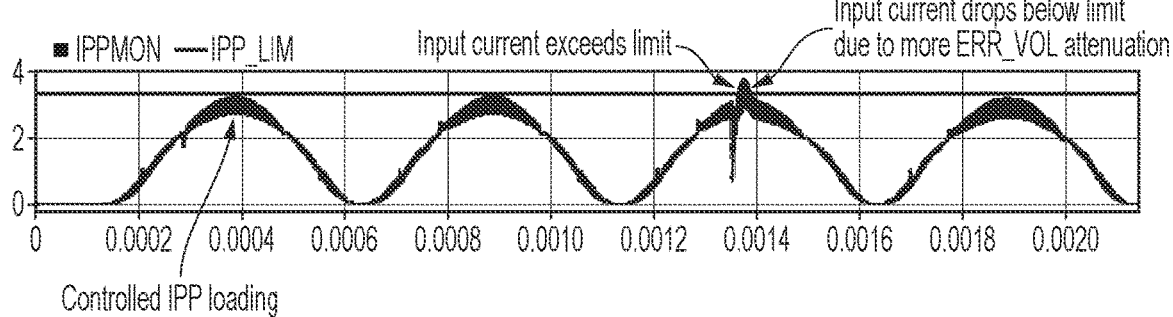
Figure 8:
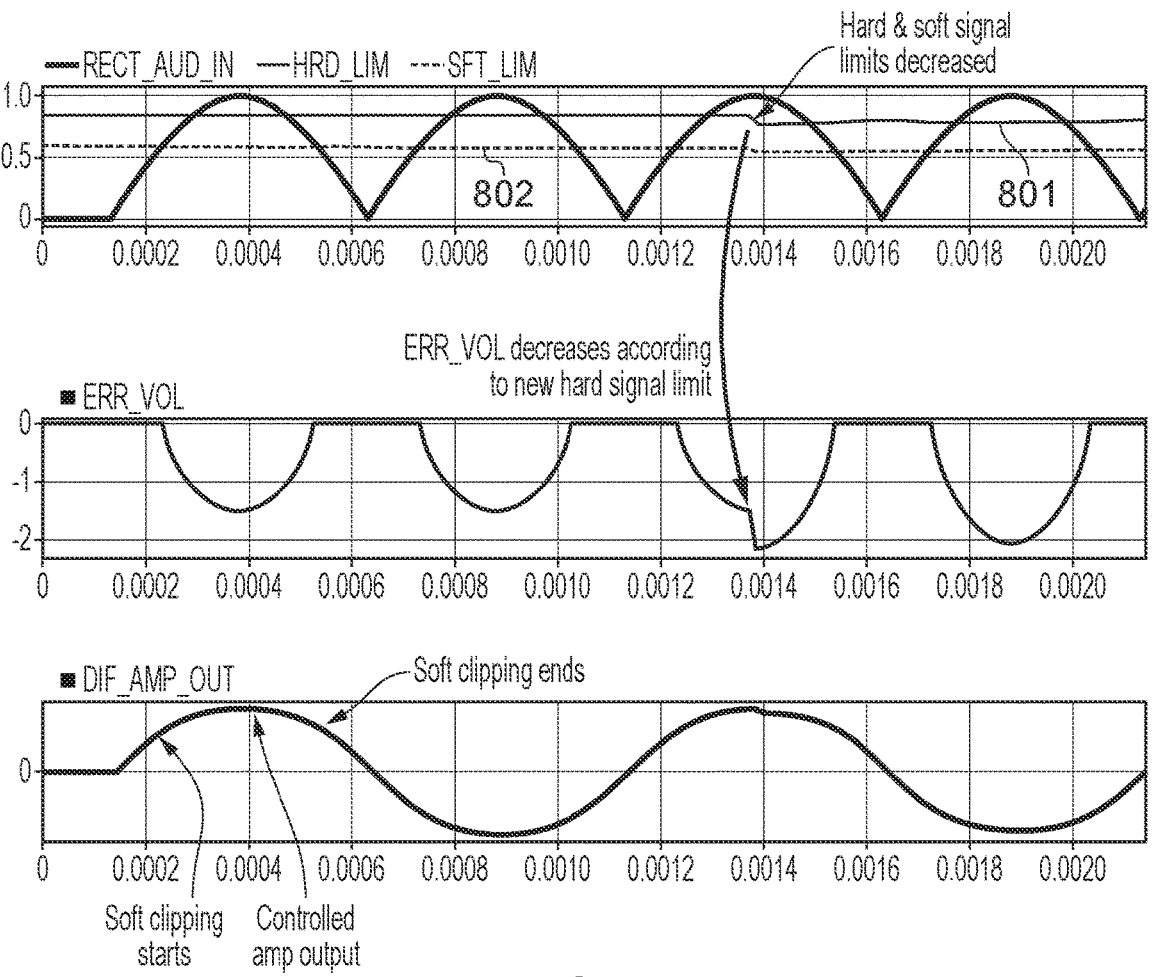

FIG. 8 illustrates various waveforms from a simulation of an amplifier circuit according to an embodiment. The top plot shows the indication VPMON of the power supply input voltage VP measured by the ADC 201. The second plot shows the monitored input current IPMON. The third plot shows the original input signal (with no attenuation applied) and the hard signal limit 801 and soft signal limit 802. The fourth plot shows the control signal ERR_VOL indicating the amount of attenuation applied to the input signal and the bottom plot illustrates the output signal.

In this simulated example, the initial value of the monitored input voltage VPMON is 3.3V. The controller 205 of the power limiter 103 first calculates the hard signal limit (HRD_LIM) 801 and soft limit (SFT_LIM) 802. In this example the scaling factor, SFT_SCALE, for determining the soft signal limit from the hard signal limit, is 70%. The controller 205 acts to apply attenuation via the ERR_VOL control signal as the input signal crosses the soft signal limit, with the attenuation being increased so that the cycle averaged input current (IPPMON) is maintained below the user set current limit IPP_LIM of 3.4 A with a soft-clipping response for the first cycle of the input signal.

In this simulated example, a 0.3V drop in the input supply voltage VP occurs at a time of around 1.35 ms, which occurs while the attenuation is being calculated and applied. This results in an over-limit condition and the input current increases over the IPP_LIM. As a result, the controller 205 of the power limiter 103 starts an attack response. The controller 205 reduces the hard and soft signal limits 801 and 802 in discrete levels configured by ATK_STEP and ATK_TIME, and in turn, additional attenuation is applied via ERR_VOL. Thus, the input current is brought back below the IPP_LIM. At this point, the hard and soft signal limits, the load impedance, and efficiency values are updated to reflect the new operating conditions. These limits are used in the next half cycle of the input signal to obtain a proper soft-clipping response.

Figure 9:
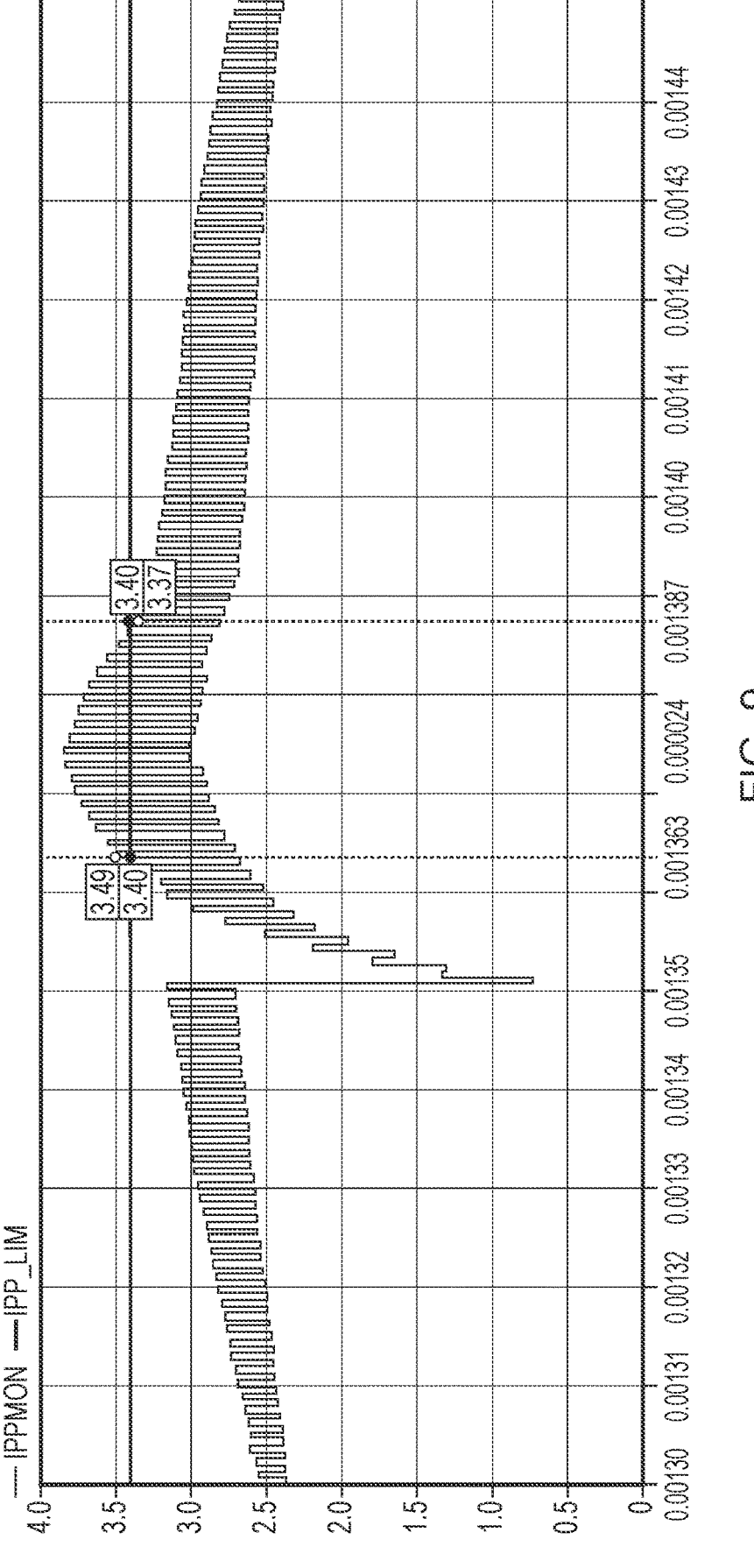
FIG. 9 illustrates an expanded view of part of the simulated response of FIG. 8.

FIG. 9 illustrates close-up view of the monitored input current IPPMON and IPP_LIM during the over-limit condition shown in FIG. 8. The input current is brought back below the IPP_LIM in 24 µs with a set of ATK_DELAY, ATK_STEP and ATK_TIME configurations for this simulation. In at least some embodiments a user has the ability to adjust the attack response by changing these configurations to meet system requirements.

Embodiments of the present disclosure thus provide a method and system for signal-based limiting output power for an amplifier. A power supply input voltage and power supply input current are input into the amplifier. The power supply input voltage and the power supply input current may be measured. In some examples a current limit may be set for the power supply input current and one or more signal voltage limits can be established based on the current limit and measured power supply input voltage. An input signal for the amplifier may be regulated based on the established voltage limit. In some cases, an error condition may be detected where the power supply input current exceeds the set current limit, and the error condition may be corrected by updating the signal voltage limits.

In some implementations the signal voltage limits may be dynamically adapted based on a feedback signal, the measured power supply input voltage and current so that available system power usage is optimized. The signal voltage limits for a switching amplifier may be dynamically adapted based on a comparison between an expected modulation index for a given input signal level and the actual modulation index applied.

In some implementations the output voltage and current and/or output power are measured or estimated through voltage, current or power monitors. In some examples, the load impedance may be measured, and the signal voltage limits may be dynamically adapted based on a detected change in the measured load impedance. In some examples, the expected system efficiency at different system operating points may be continuously or periodically measured and the signal limits dynamically adapted accordingly. The signal voltage limits may, in some cases, be adapted by a feedforward path to the expected system efficiencies at different system operating points.

The power supply input voltage and current may each be monitored using an ADC. The measured power supply input voltage and current may be used to calculate the power supply input power. A power limit for the calculated power supply input power may be set instead of, or in addition to, a current limit. In which case, an error condition may be detected where the power supply input power exceeds the set power limit. Establishing the signal voltage limit may further involve using load impedance and system efficiency data to establish the signal voltage limits. Adapting the voltage limits may further involve adapting the signal voltage limits to changes in load impedance and system efficiency and temperature.

One aspect of the present disclosure relates to a method for signal-based limiting of output power for an amplifier. The method of this aspect comprises inputting a power supply input voltage and power supply input current into the amplifier, measuring the power supply input voltage and the power supply input current, setting a current limit for the power supply input current, establishing one or more signal voltage limits based on the current limit and measured power supply input voltage and regulating an input signal based on the established voltage limit(s). The method may comprise detecting an error condition where the power supply input current exceeds the set current limit and correcting the error condition by updating the one or more signal voltage limit(s). The method may additionally or alternatively comprise dynamically adapting the one or more signal voltage limits. In some cases, the one or more signal voltage limits may be adjusted based on a feedback signal, the measured power supply input voltage and current so that available system power usage is optimized. In some cases, the one or more signal voltage limits may be adjusted based on an error between the set current limit and the measured power supply input current when a feedback signal is at or within a set range of the one or more signal voltage limit(s). In some cases, where the amplifier is a switching amplifier, the one or more signal voltage limits may be adjusted based on a comparison between an expected modulation index for a given input signal level and the applied modulation index. In some cases, the method may comprise measuring or estimating the output voltage, current and power through voltage, current or power monitors, measuring the load impedance and dynamically adapting the one or more signal voltage limit(s) based on a detected change in the measured load impedance. The method may further comprise measuring and dynamically adapting the expected system efficiency at different system operating points continuously and adapting the one or more signal voltage limit(s) by a feedforward path to the expected system efficiencies at different system operating points.

The measurement of power supply input voltage and current may be performed by using an ADC. The measured power supply input voltage and current may be used to calculate the power supply input power. In some cases, the method may involve setting a power limit instead of a current limit for the calculated power supply input power. The method may involve detecting an error condition where the power supply input power exceeds the set power limit. In some cases, correcting the error condition may be done by updating the one or more signal voltage limits using a stepwise response. Correcting the error condition may be done by updating the one or more signal voltage limits being based on the error between the set current limit and the measured input current.

The method may further comprise using load impedance and system efficiency data to establish the one or more signal voltage limits. The step of adapting the one or more signal voltage limits(s) may be based on the feedback signal, the measured power supply input voltage and current may further comprise adapting the one or more signal voltage limits to changes in load impedance and system efficiency and temperature. The step of adapting the one or more signal voltage limits(s) based on the error between the set current limit and the measured power supply input current may further comprise adapting the one or more signal voltage limit(s) by using a proportional-integral (PI) controller.

The examples above have been discussed in the context of driving a transducer, which may in particular be an audio transducer, and embodiments of the present disclosure may advantageously be used in audio application or other applications for driving a transducer, e.g., such as haptic output transducer. However, the power limiting control may be applied to any application in which an amplifier is used to output an output voltage to a load based on an input signal, in particular a switching driver, and especially one in which at least one voltage that may be used as a switching voltage is generated by a capacitive voltage generator.

The amplifier circuit of embodiments of the disclosure may be suitable for driving an output transducer. The output transducer may be, in some implementations, an audio output transducer such as a loudspeaker or the like. The output transducer may be a haptic output transducer. In some implementation the output transducer may be driven in series with an inductor, i.e., there may be an inductor in an output path between an output node of the switching driver and the load. In some implementations the transducer may be a piezoelectric or ceramic transducer.

Embodiments may be implemented as an integrated circuit. Embodiments may be implemented in a host device, especially a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle or interactive display. There is further provided a host device incorporating the above-described embodiments.

The skilled person will recognise that some aspects of the above-described apparatus and methods, for instance for setting of limits, may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog™ or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. An amplifier apparatus for outputting an output signal based on an input signal comprising:
   an amplifier configured to receive an input supply voltage and to draw, in use, an amplifier input current resulting in an amplifier input power; and
   a power limiter configured to:
       monitor an indication of the amplifier input power;
       determine a first signal limit based on said indication of the amplifier input power and a pre-set limit; and
       apply regulation to the input signal to provide a regulated input signal for input to the amplifier that does not exceed the first signal limit.

2. The amplifier apparatus of claim 1 wherein the power limiter is further configured to determine a second signal limit of lower magnitude than the first signal limit and with a defined relationship to the first signal limit and to controllably vary a gain applied to the input signal for signal levels that exceed the second signal limit to generate the regulated input signal.

3. The amplifier apparatus of claim 1 wherein said indication of the amplifier input power comprises an indication of the input supply voltage and an indication of the amplifier input current.

4. The amplifier apparatus of claim 3 wherein the pre-set limit comprises a pre-set limit of amplifier input power and/or a pre-set limit of amplifier input current.

5. The amplifier apparatus of claim 4 wherein the power limiter is configured to determine a first error condition when:
   the amplifier input power monitored by the power limiter exceeds the pre-set amplifier input power limit; or
   the indication of amplifier input current exceeds the pre-set amplifier input current limit;
   and the power limiter is configured, in the event of a first error condition to update said first signal limit to correct the error condition.

6. The amplifier apparatus of claim 5 wherein the power limiter is configured to determine a second error condition if the amplifier input power monitored by the power limiter exceeds a maximum input power limit which is higher than the pre-set input power limit or if the indication of amplifier input current exceeds a maximum current limit which is higher than the pre-set amplifier input current, and in the event of a second error condition the power limiter is configured to update the first signal limit to correct the error condition, wherein the updating of the first signal limit is more rapid for an instance of the second error condition than for an instance of the first error condition.

7. The amplifier apparatus of claim 4 wherein the power limiter is configured to dynamically adjust the first signal limit based on a feedback signal of the regulated input signal and said indication of the amplifier input power.

8. The amplifier apparatus of claim 7 wherein the power limiter is configured to dynamically adjust said first signal limit based on a determined difference between the amplifier input power or amplifier input current and the pre-set input power limit or current limit, respectively, when the signal level of regulated input signal is at or within a defined range of the first signal limit.

9. The amplifier apparatus of claim 8 wherein the power limiter comprises a proportional-integral controller configured to adjust said first signal limit to minimise said determined difference.

10. The amplifier apparatus of claim 1 wherein the power limiter is configured to determine said first signal limit also based on one or more parameters of a first set of system operating parameters comprising input supply voltage, load impedance, amplifier efficiency and temperature.

11. The amplifier apparatus of claim 10 wherein the power limiter is configured to dynamically adapt said first signal limit in use due to changes in said one or more parameters.

12. The amplifier apparatus of claim 10 wherein said one or more parameters comprises load impedance and the power limiter is configured to determine the load impedance from an indication of amplifier output voltage and an indication of amplifier output current.

13. The amplifier apparatus of claim 10 wherein said one or more parameters comprises amplifier efficiency and the power limiter is configured to monitor amplifier efficiency.

14. The amplifier apparatus of claim 10 wherein said one or more parameters comprises amplifier efficiency and the power limiter comprises a set of stored estimated amplifier efficiencies for different operating conditions and the power limiter is configured to select an appropriate one of the stored estimated amplifier efficiencies based on the present system operating conditions.

15. The amplifier apparatus of claim 10 wherein the amplifier comprises a switching amplifier for modulating at least one output node between different switching voltages with a controller duty-cycle to generate the output signal.

16. The amplifier apparatus of claim 15 wherein the switching amplifier is a closed-loop switching amplifier and wherein the power limiter is configured to receive an indication of the duty-cycle of the closed-loop switching amplifier and to dynamically adjust the first signal limit based on said indication of the duty-cycle.

17. The amplifier apparatus of claim 16 wherein the power limiter is configured to dynamically adjust the first signal limit based on a comparison of said indication of the duty-cycle to a determined expected duty-cycle for a given level of regulated input signal.

18. The amplifier apparatus of claim 15 wherein the switching amplifier is configured such that, in at least one amplifier operating mode, at least one of said switching voltages may be generated by a capacitive voltage generator of the switching amplifier.

19. An amplifier apparatus for outputting an output signal based on an input signal comprising:

an amplifier configured to receive an input supply voltage and to draw, in use, an amplifier input current resulting in an amplifier input power; and a power limiter configured to:

monitor an indication of the amplifier input power;

determine a first signal limit based on at least one of a pre-set limit of amplifier input current and a pre-set limit of amplifier input power and also based on an indication of the input supply voltage and one or more parameters of the set of load impedance, amplifier efficiency and temperature; and apply regulation to the input signal to provide a regulated input signal for input to the amplifier that does not exceed the first signal limit.

20. A method for signal-based limiting of output power for an amplifier comprising:

monitoring an indication of an input supply voltage for the amplifier and an indication of an amplifier input current drawn in use;

determining a first signal limit based on at least one of a pre-set limit of amplifier input current and a pre-set limit of amplifier input power and at least one of said indication of the input supply voltage and said indication of the amplifier input current; and regulating an input signal to provide a regulated input signal for input to the amplifier that does not exceed the first signal limit.

\* \* \* \* \*